(12) United States Patent
Lechner

(10) Patent No.: US 8,964,823 B2
(45) Date of Patent: Feb. 24, 2015

(54) FREQUENCY SELECTIVE MEASURING DEVICE AND FREQUENCY SELECTIVE MEASURING METHOD

(75) Inventor: Thomas Lechner, Kirchheim (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 398 days.

(21) Appl. No.: 13/386,589

(22) PCT Filed: Apr. 28, 2010

(86) PCT No.: PCT/EP2010/002620
§ 371 (c)(1),
(2), (4) Date: Mar. 15, 2012

(87) PCT Pub. No.: WO2011/009504
PCT Pub. Date: Jan. 27, 2011

(65) Prior Publication Data
US 2012/0163441 A1   Jun. 28, 2012

(30) Foreign Application Priority Data
Jul. 21, 2009 (DE) .......................... 10 2009 034 093

(51) Int. Cl.
*H04B 17/00* (2006.01)
*G01R 31/28* (2006.01)
*G01R 23/20* (2006.01)

(52) U.S. Cl.
CPC ............ *G01R 31/2837* (2013.01); *G01R 23/20* (2013.01)
USPC ........................................................ 375/224

(58) Field of Classification Search
CPC ............................ G01R 31/2837; G10L 25/69
USPC .................................... 375/224; 704/203, 269
See application file for complete search history.

(56) References Cited

U.S. PATENT DOCUMENTS

| 5,402,495 | A |   | 3/1995 | Kim |
|---|---|---|---|---|
| 5,603,088 | A | * | 2/1997 | Gorday et al. ............. 455/67.13 |
| 5,867,813 | A |   | 2/1999 | Di Pietro et al. |
| 6,064,966 | A | * | 5/2000 | Beerends ....................... 704/500 |
| 6,205,202 | B1 |   | 3/2001 | Yoshida et al. |
| 2006/0241942 | A1 | * | 10/2006 | Chen et al. ..................... 704/230 |

(Continued)

FOREIGN PATENT DOCUMENTS

DE    37 09 556 A1    10/1988
EP    0 030 724 A2    6/1981

(Continued)

OTHER PUBLICATIONS

CS Strumentazione Elettronica S.r.l.: CS6015-Ultra low cost, full optional Telephone Test Equipment, Jan. 2006. URL: http://www.cs-strumentazione.it/hires/cs6015%20depliant.pdf (accessed on Oct. 7, 2009), pp. 1-4.

(Continued)

*Primary Examiner* — David B. Lugo
(74) *Attorney, Agent, or Firm* — Ditthavong & Steiner, P.C.

(57) ABSTRACT

A measuring device is provided that includes a first transformation device, a first time-quantization device and a selection device. The first transformation device implements a transformation of at least one signal into the frequency domain. The first time-quantization device subdivides at least one signal into several signals disposed in time succession. The selection device implements a selection of partial signals suitable for a measurement.

20 Claims, 4 Drawing Sheets

(56) References Cited

U.S. PATENT DOCUMENTS

2009/0028357 A1  1/2009  Zhao et al.
2010/0153101 A1* 6/2010  Fernandes ............... 704/220
2011/0051957 A1* 3/2011  Jougit et al. ............. 381/94.1

FOREIGN PATENT DOCUMENTS

| EP | 0 284 077 A1 | 3/1988 |
| EP | 2 012 558 A2 | 1/2009 |
| GB | 2 096 331 A | 10/1982 |
| WO | WO 89/08357 A1 | 9/1989 |
| WO | WO 95/15035 A1 | 6/1995 |

OTHER PUBLICATIONS

International Preliminary Examination Report for PCT/EP2010/002620 dated Oct. 27, 2011, pp. 1-29.
International Search Report for PCT/EP2010/002620 dated Oct. 27, 2010, pp. 1-6.
Nom IEEE Standard 269TM-2002, Apr. 25, 2003; Standard Methods for Measuring Transmission Performance of Analog and Digital Telephone Sets, Handsets, and Headsets, Annex F: test signals, pp. 1-10.
International Preliminary Report on Patentability for related International Application No. PCT/EP2010/002620 dated Mar. 8, 2012, pp. 1-18.

* cited by examiner

FREQUENCY SELECTIVE MEASURING DEVICE AND FREQUENCY SELECTIVE MEASURING METHOD

CROSS-REFERENCE TO RELATED APPLICATION

The present application is a national phase application of PCT Application No. PCT/EP2010/002620, filed on Apr. 28, 2010, and claims priority to German Application No. 10 2009 034 093.9, filed on Jul. 21, 2009, the entire contents of which are herein incorporated by reference.

BACKGROUND OF THE INVENTION

1. Field of the Invention

The invention relates to a measuring method and a measuring device for frequency selective measurement.

2. Discussion of the Background

Audio devices such as mobile telephones and hearing aids often comprise a transmission technology, which is adapted to the signals to be transmitted. Accordingly, it is not always possible to determine the transmission properties with synthetic signals such as sinusoidal sweeps or multi-sinusoidal sound mixes. Speech codecs of mobile telephones distort the spectrum of such test signals as do frequency-dependent compressors in hearing aids. The measurement of the resting noise is often hindered by so-called noise gates, which switch the output of a transmission path to mute if no input signal is connected.

Traditionally, when testing mobile telephones, a transmission frequency response is often determined through a series of generally gap-free or overlapping spectral transformations, of which the spectrum is averaged at the input and output of the transmission path over the duration of the test signal. In the IEEE standard 269™-2002 dated 25 Apr. 2003, a measurement for the differentiation between spectra simultaneously determined and conditioned in a hearing-compatible manner is calculated at the input and output of the transmission path.

SUMMARY OF THE INVENTION

The invention provides a measuring device and a measuring method which allow a reliable and accurate measurement of devices under test.

A measuring device according to the invention comprises a first transformation device, a first time-quantization device and a selection device. The first transformation device implements a transformation of at least one signal into the frequency domain. The first time-quantization device subdivides at least one signal into several signals disposed in time succession. The selection device implements a selection of partial signals suitable for a measurement.

The first transformation device and the first time-quantization device preferably process the test signal in succession and preferably generate from it frequency-time partial test signals. Such frequency-time partial test signals are excerpts of the test signal in the time domain and frequency domain. The partial test signals selected by the selection device are frequency-time partial test signals. Accordingly, a reliable measurement of the device under test is achieved even in frequency ranges which are difficult to measure.

The measuring device preferably further comprises a synchronization device. This synchronization device implements a synchronization of the test signal with an output signal output from a device under test. This achieves an accurate time agreement of the partial signals compared and therefore also a good accuracy of measurement.

The measuring device preferably further contains a second transformation device and a second time-quantization device. The second transformation device advantageously implements a transformation of at least one signal into the frequency domain. The second time-quantization device subdivides at least one signal into several signals disposed in time succession. The second transformation device and the second time-quantization device preferably process the output signal in succession and generate from it frequency-time partial output signals. These frequency-time partial output signals are excerpts of the output signal in the time domain and frequency domain. This achieves a high degree of agreement of the partial test signals and partial output signals and therefore good accuracy of the measurements.

The measuring device advantageously further comprises a processing device. The processing device preferably compares the frequency-time partial test signals and associated frequency-time partial output signals. The processing device preferably determines a frequency response and/or a noise level from the comparison. In this manner, test results can be achieved at low cost.

The selection device preferably determines frequency-time partial test signals suitable for a measurement by comparing their mean power with at least one threshold value. In this manner, a reliable measurement of good accuracy is possible.

The selection device preferably determines frequency-time partial test signals suitable for a measurement by comparing their mean power with at least one upper and one lower threshold value. In this manner, a further increase in the reliability and accuracy of the measurement is possible.

BRIEF DESCRIPTION OF THE DRAWINGS

In the next section, the invention is described by way of example on the basis of the drawings in which an advantageous exemplary embodiment of the invention is presented. The drawings are as follows.

DETAILED DESCRIPTION OF EXEMPLARY EMBODIMENTS OF THE INVENTION

The problems on which the measuring method according to the invention and the measuring device according to the invention are based are first explained with reference to FIG. 1. The structure and method of functioning of the device according to the invention are illustrated with reference to FIGS. 2-6. On the basis of FIG. 7-9, the functioning of the measuring method according to the invention is then presented. A repetition of the presentation and description of identical elements in similar drawings has in some cases not been provided.

Figure 1:
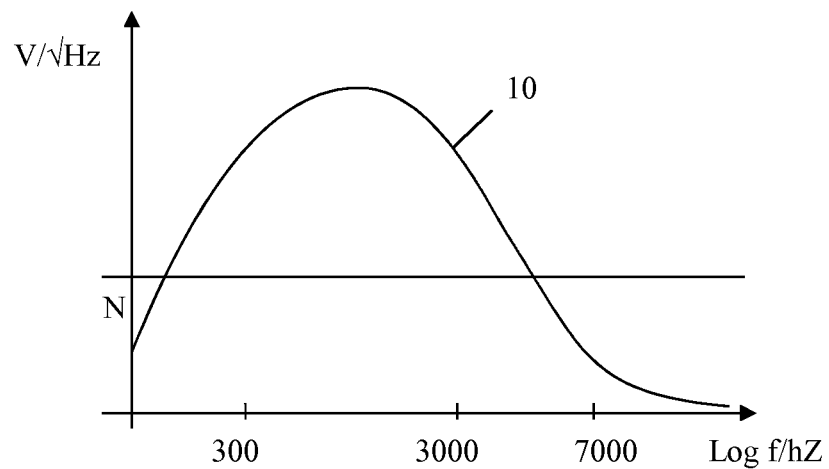
FIG. 1 shows the frequency response of an exemplary speech signal.

FIG. 1 shows the averaged spectrum 10 of an exemplary speech signal. In this context, it is clear that the power of the speech signal is disposed largely within the range between 300 and 3000 Hz. Especially at high frequencies, for example, 7000 Hz, the power of the speech signal is disposed below the noise level N.

However, in order to determine a frequency response, it is also necessary to measure frequency ranges, at which typical speech signals provide only small power components. Moreover, it causes difficulties to determine the resting noise level when using natural speech signals as a test signal, because noise gates (noise gates) switch the output to mute as soon as the input signal is disposed below a given threshold.

Figure 2:
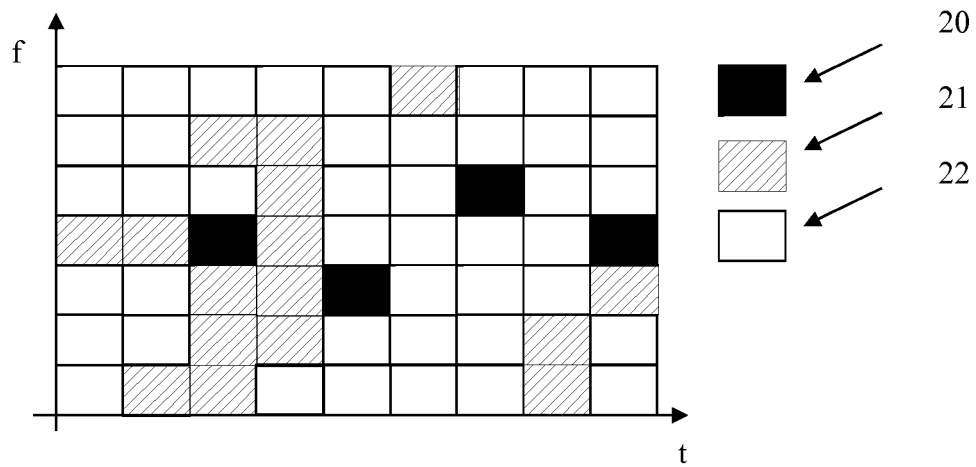
FIG. 2 shows an exemplary test signal in the time domain and frequency domain.

FIG. 2 presents an exemplary test signal simultaneously in the time domain and the frequency domain. In this context, the test signal is quantized into time-frequency partial test signals 20, 21, 22. The presentation of the individual time-frequency partial test signals 20, 21, 22 in this context indicates the level. Time-frequency partial test signals 20 illustrated in black provide a level which indicates an over-control or at least a saturation. Time-frequency partial test signals 21, which are illustrated with shading, provide an average level and are therefore suitable for determining a frequency response of the device under test. Time-frequency partial test signals 22, which are illustrated in white, provide a very low level and are therefore suitable for determining the resting noise level within the respective frequency range.

If the frequency response of a device under test is to be determined, the device under test is supplied with the entire test signal. However, for the determination of the frequency response, only time-frequency partial output signals which correspond to the time-frequency partial test signals 21 are used in the output signal of the device under test. By contrast, if the resting noise level is to be determined, the device under test is supplied with the entire test signal, however, the resting noise level is determined only from the time-frequency partial output signals which correspond to the time-frequency partial test signals 22. So long as a level is present in at least one frequency range, the noise gate of the device under test does not switch the output to mute and the other frequency ranges in which no level is present can be measured with regard to the resting noise level.

If sufficient suitable partial signals are not present for the determination of the resting noise level in all frequency ranges, a targeted muting of individual partial signals is also possible. Since individual frequency ranges are only ever muted for a short time, there is no risk of impairing the device under test through this manipulation.

Figure 3:
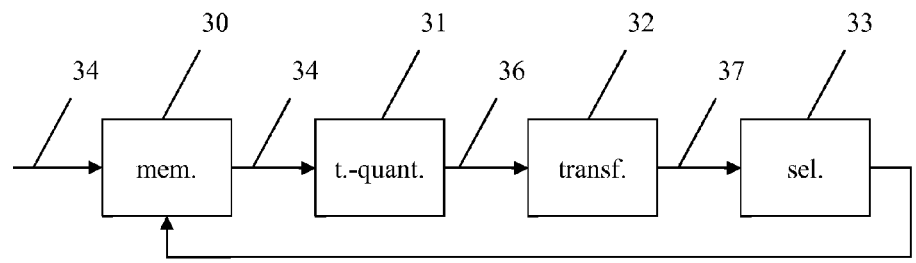
FIG. 3 shows a first exemplary embodiment of the measuring device according to the invention.

FIG. 3 shows a first exemplary embodiment of the measuring device according to the invention. Here, a first part of such a measuring device is presented. A buffer device 30 is connected to a time-quantization device 31. The time-quantization device 31 is further connected to a transformation device 32. Moreover, the transformation device 32 is connected to a selection device 33. The buffer device 30 is supplied with a test signal 34 already present in digital form. This is buffered by the buffer device 30 for subsequent use. At a later time, the test signal 34 is transmitted from the buffer device 30 to the time-quantization device 31. The latter subdivides the test signal 34 into several time partial test signals. In each case, these represent a time excerpt of the test signal 34. The time partial test signals 36 are rerouted to the transformation device 32. The transformation device 32 transforms each individual time partial test signal into the frequency domain and, in this manner, generates a plurality of frequency-time partial test signals 37 from each time partial test signal. These are rerouted to the selection device 33. Optionally, the frequency-time partial test signals 37 overlap in the frequency domain. The selection device 33 implements a selection of the frequency-time partial test signals 37 and reroutes the results to the buffer device 30. The buffer device 30 buffers the results of the selection for subsequent use.

The selection device 33 implements this selection on the basis of levels of the individual frequency-time partial test signals it has determined. Accordingly, on the basis of a minimum level, it determines which frequency-time partial test signals 37 are suitable for determining the frequency response of a device under test. On the basis of the same threshold, it determines which frequency-time partial test signals can be used to determine the resting noise level of the device under test. Optionally, a different threshold can be used in order to determine the resting noise level. Accordingly, a level range, within which the corresponding frequency-time partial test signals are unused, can be disposed between the thresholds. Optionally, the selection device uses a further upper threshold which indicates a saturation or over-control of the device under test. If a frequency-time partial test signal 37 exceeds the second upper threshold, it is not used for the measurement, because the results would be falsified.

Figure 4:
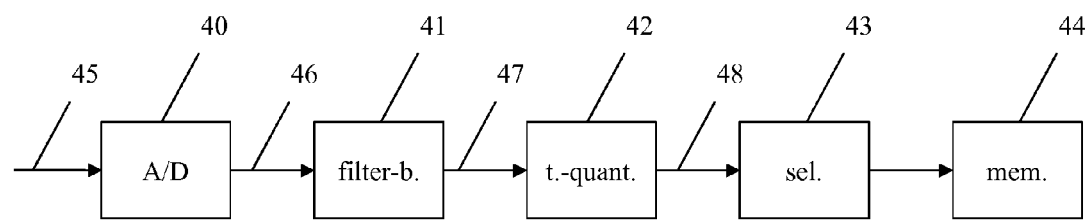
FIG. 4 shows a second exemplary embodiment of the measuring device according to the invention.

In FIG. 4, a second exemplary embodiment of the measuring device according to the invention is presented. Here, an alternative embodiment of a first part of such a measuring device is presented. An analog-digital converter 40 is connected to a filter bank 41. The filter bank 41 is connected to a time-quantization device 42. The time-quantization device 42 is further connected to a selection device 43. The selection device 43 is further connected to a buffer device 44.

In this exemplary embodiment, the test signal 45 is not already present in digital form. The analog test signal 45 is supplied to the analog-digital converter 40. The latter digitises the test signal 45 to form a digital test signal 46. The digital test signal 46 is supplied to the filter bank 41. The filter bank 41 transforms the digital test signal 46 into the frequency domain and accordingly generates from the digital test signal 46 a plurality of frequency partial test signals 47. These are transmitted to the time-quantization device 42. The time-quantization device 42 generates from the individual frequency partial test signal a plurality of frequency-time partial test signals 48. That is, it breaks down each individual frequency partial test signal into several frequency-time partial test signals 48 disposed in time succession. These are rerouted to the selection device 43. Optionally, the frequency-time partial test signals 48 overlap in time. The selection device 43 corresponds to the selection device 33 from FIG. 3. The results of the selection are transmitted, as also in FIG. 3, to the buffer device 44 and buffered by the latter for subsequent use.

The analysis of the test signal 34 or respectively 45 presented on the basis of FIGS. 3 and 4 need only be implemented once per test signal. This need not be disposed in a time relationship with the actual measurement, which is illustrated below with reference to FIG. 5.

Figure 5:
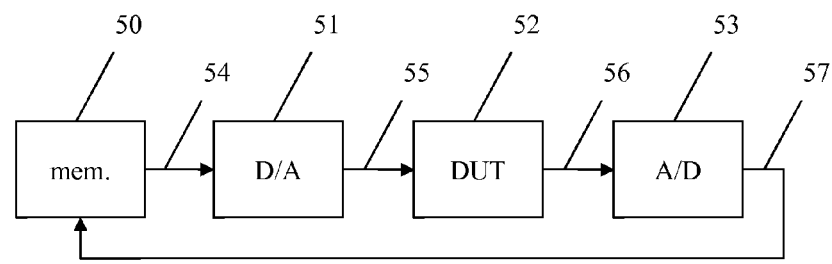
FIG. 5 shows a third exemplary embodiment of the measuring device according to the invention.

FIG. 5 shows a third exemplary embodiment of the measuring device according to the invention. A second part of the measuring device is illustrated here. A buffer device 50 is connected to a digital-analog converter 51. The digital-analog converter 51 is connected to a device under test 52. The device under test 52 is further connected to an analog-digital converter 53. The analog-digital converter 53 is once again connected to the buffer device 50.

The buffer device 50 outputs the test signal 54, already analysed on the basis of FIGS. 3 and 4, to the digital-analog converter 51. The digital-analog converter 51 converts the digital test signal 54 into an analog test signal 55 and supplies this to the device under test 52. The test signal 55 passes through the device under test 52 and is output as an output signal 56. This is an analog signal. The analog output signal 56 is supplied to the analog-digital converter 53 which converts it into a digital output signal 57. The digital output signal 57 is once again supplied to the buffer device 50 which buffers it for subsequent processing.

Figure 6:
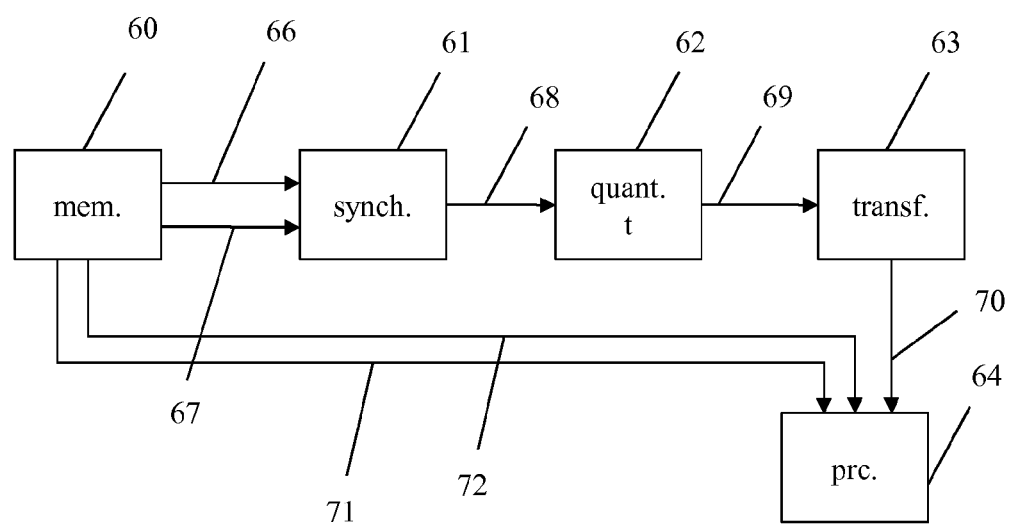
FIG. 6 shows a fourth exemplary embodiment of the measuring device according to the invention.

FIG. 6 shows a fourth exemplary embodiment of the measuring device according to the invention. Here, a third part of the measuring device is illustrated. A buffer device 60 is connected to a synchronization device 61. The synchronization device 61 is further connected to a time-quantization device 62. This is further connected to a transformation device 63. The buffer device 60, the synchronization device 61 and the transformation device 63 are, furthermore, connected to a processing device 64.

The original test signal and the output signal from the device under test are buffered in the buffer device 60. Moreover, the results of the selection, as shown in FIGS. 3 and 4, are buffered in the buffer device 60. The buffer device 60 reroutes the original test signal 66 and the output signal 67 to the synchronization device 61. The synchronization device 61 implements a synchronization of both signals. That is, the synchronization device 61 determines the precise time offset, which is generated by passing through the device under test, in the output signal by comparison with the test signal. The synchronization device 61 further determines the phase difference between the two input signals. As an alternative, a separate determination of the signal delay time of the device under test is possible, for example, by means of sound bursts. If the playback of the original test signal and the recording of the output signal of the device under test started exactly simultaneously, the synchronization can also be realized through a time displacement of the two buffered signals relative to one another by the measured signal delay time.

The synchronization device 61 further transmits a synchronized output signal 68 to the time-quantization device 62. This breaks down the synchronized output signal into time partial output signals 69. These are transmitted to the transformation device 63. The transformation device 63 generates a plurality of frequency-time partial output signals 70 from every individual time partial output signal.

The frequency-time partial output signals 70 correspond in their position on the time axis and the frequency axis to the frequency-time partial test signals from FIGS. 3 and 4. The frequency-time partial output signals 70 are transmitted to the processing device 64. Moreover, a plurality of frequency-time partial test signals 71 and the selection results 72 are transmitted from the buffer device 60 to the processing device 64. The processing device 64 compares the frequency-time partial output signals 70 with the respectively associated frequency-time partial test signals 71. In this context, the selection results 72 are taken into consideration. As shown with reference to FIGS. 1 and 2, only given partial signals are used for given measurements. Accordingly, the processing device 64 preferably determines the amplitude frequency response of the device under test. A determination of the phase frequency response is also possible, for example, by using a complex FFT (Fast Fourier Transform). Moreover, the resting noise level of the device under test can be determined. By averaging over several partial signals, a uniform result is achieved. The result of the measurements can then optionally be buffered in a buffer device for subsequent use. Alternatively, a direct output is possible.

Figure 7:
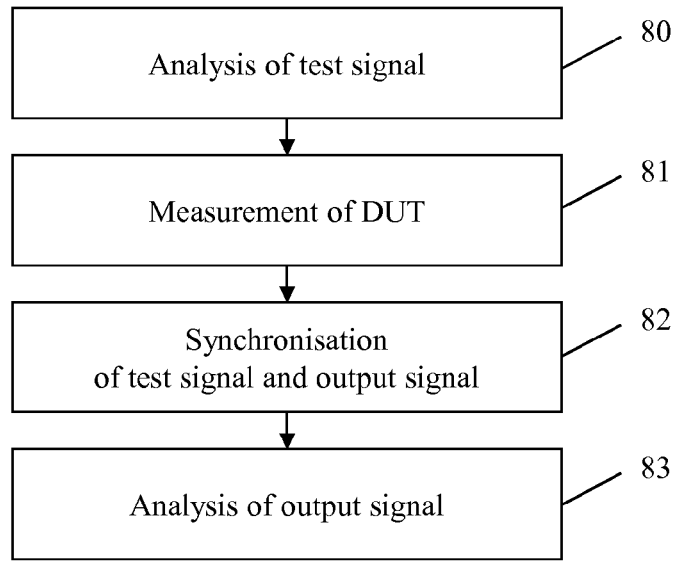
FIG. 7 shows a first exemplary embodiment of the measuring method according to the invention.

FIG. 7 shows a first exemplary embodiment of the measuring method according to the invention. In a first step 80, an analysis of the test signal is implemented. This is explained in greater detail with reference to FIG. 8. In the second step 81, a measurement is implemented on a device under test. That is, the device under test is supplied with the test signal, while the output of the device under test is measured. In a third step 82, a synchronization of the test signal and the output signal of the device under test is implemented. For example, a correlation can be used for this purpose. In a fourth step 83, the output signal of the device under test is analysed. This is explained in greater detail with reference to FIG. 9.

Figures 8, 9:
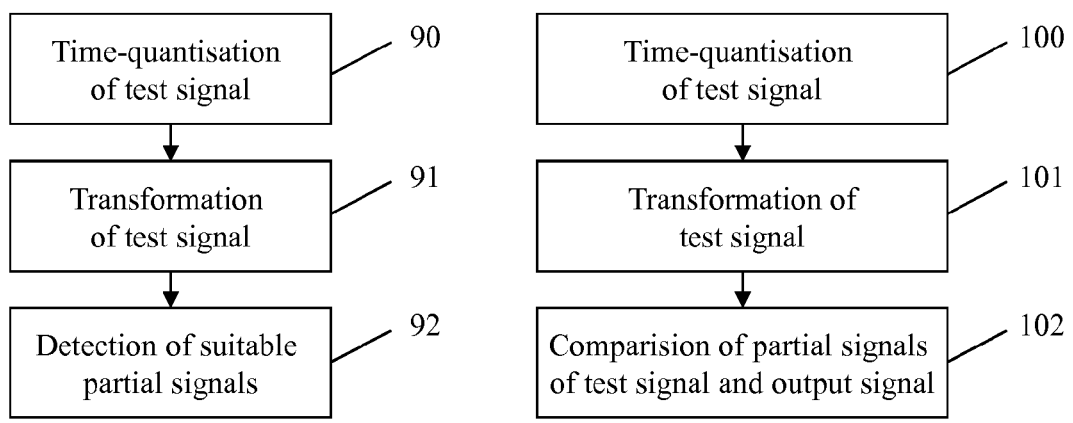
FIG. 8 shows a second exemplary embodiment of the measuring method according to the invention.
FIG. 9 shows a third exemplary embodiment of the measuring method according to the invention.

FIG. 8 shows a second exemplary embodiment of the measuring method according to the invention. This shows the first step 80 from FIG. 7 in greater detail. In a first step 90, a time-quantization of the test signal is implemented. That is, the test signal is broken down into a plurality of time partial test signals disposed in time succession. In a second step 91, a transformation of the test signal into the frequency domain is implemented. That is, the time partial test signals are each subjected to a transformation into the frequency domain. Accordingly, they are broken down into individual frequency-time partial test signals. In a third step 92, these frequency-time partial test signals are subjected to a selection. That is, the levels of the partial signals are determined, and partial signals are selected on the basis of the determined levels. This selection is implemented as already described on the basis of FIG. 2.

FIG. 9 presents a third exemplary embodiment of the measuring method according to the invention. This shows the fourth step 83 from FIG. 7 in greater detail. In a first step 100, a time-quantization of the output signal of the device under test is implemented. That is, the output signal is broken down into a plurality of time partial output signals disposed in time succession. In a second step 101, the output signal is transformed into the frequency domain. That is, each individual time partial output signal is subjected to a transformation into the frequency domain. Accordingly, a plurality of frequency-time partial output signals is generated. In a third step 102, these partial signals are compared with the frequency-time partial test signals from FIG. 8. Because of the synchronization, the frequency-time partial test signals agree with the frequency-time partial output signals with regard to their position in time and their frequency range. On the basis of the comparison, the frequency response and/or the resting noise level are determined. A uniform result is achieved by averaging several partial signals.

The invention is not restricted to the exemplary embodiment presented. Accordingly, different measurements can be implemented. Alongside the amplitude frequency response and the resting noise level, a measurement of further parameters, such as the phase frequency response, is also possible. All of the features described above or shown in the drawings can be advantageously combined with one another as required within the framework of the invention.

The invention claimed is:

1. A measuring device comprising a first transformation device, a first time-quantization device and a selection device,
    wherein the first transformation device implements a transformation of at least one signal into the frequency domain,
    wherein the first time-quantization device subdivides at least one signal into several signals disposed in time succession, wherein the selection device implements a selection of partial signals suitable for a measurement, and wherein the first transformation device and the first time-quantization device process a test signal in succession and generate from it frequency-time partial test signals, wherein the frequency-time partial test signals are excerpts of the test signal in the time domain and frequency domain, wherein the partial signals selected by the selection device are frequency-time partial test signals, and wherein the selection device determines frequency-time partial test signals suitable for a measurement by comparing their mean power with at least one upper threshold value, the frequency-time partial test signals being applied to a device under test, and the device under test adapted to generate an output signal based upon the test signals applied thereto.

2. The measuring device according to claim 1, wherein the measuring device contains a synchronization device, and wherein the synchronization device implements a synchronization of the test signal with an output signal output from a device under test.

3. The measuring device according to claim 2, wherein the measuring device further contains a second transformation device and a second time-quantization device, wherein the second transformation device implements a transformation of at least one third signal into the frequency domain, wherein the second time-quantization device subdivides at least one fourth signal into several signals disposed in time succession, wherein the second transformation device and the second time-quantization device process the output signal in succession and generate from it frequency-time partial output signals, and wherein frequency-time partial output signals are excerpts from the output signal in the time domain and frequency domain.

4. The measuring device according to claim 3, wherein the measuring device comprises a processing device, wherein the processing device compares frequency-time partial test signals and frequency-time partial output signals associated in time and in the frequency domain, wherein the processing device determines mutually associated frequency-time partial test signals and frequency-time output signals on the basis of the synchronization by the synchronization device.

5. The measuring device according to claim 4, wherein the processing device determines a frequency response and/or a noise level from the comparison.

6. The measuring device according to claim 1, wherein the selection device determines frequency-time partial test signals suitable for a measurement by comparing their mean power with at least one upper and one lower threshold value.

7. The measuring device according to claim 2, wherein the selection device determines frequency-time partial test signals suitable for a measurement by comparing their mean power with at least one upper and one lower threshold value.

8. The measuring device according to claim 3, wherein the selection device determines frequency-time partial test signals suitable for a measurement by comparing their mean power with at least one upper and one lower threshold value.

9. The measuring device according to claim 4, wherein the selection device determines frequency-time partial test signals suitable for a measurement by comparing their mean power with at least one upper and one lower threshold value.

10. The measuring device according to claim 5, wherein the selection device determines frequency-time partial test signals suitable for a measurement by comparing their mean power with at least one upper and one lower threshold value.

11. A measuring method comprising the following steps:

transformation of at least one first signal into the frequency domain, subdivision of at least one second signal into several signals disposed in time succession, selection of partial signals suitable for a measurement, generating frequency-time partial test signals through the successive first transformation into the frequency domain and the first subdivision into signals disposed in time secession, wherein the selected partial signals are frequency-time partial test signals, and determining frequency-time partial test signals suitable for a measurement by comparing their mean power with at least one upper threshold value, wherein the frequency-time partial test signals are applied to a device under test, and the device under test is adapted to generate an output signal based upon the test signals applied thereto.

12. The measuring method according to claim 11, wherein a synchronization of the test signal with an output signal output by a device under test is implemented.

13. The measuring method according to claim 12, wherein a second transformation of at least one third signal into the frequency domain is implemented, wherein a second subdivision of at least one fourth signal is subdivided into several signals disposed in time succession, wherein, through successive implementation of the second transformation into the frequency domain and of the second subdivision into signals disposed in time succession, frequency-time partial output signals are generated, and wherein frequency-time partial output signals are excerpts of the output signal in the time domain and frequency domain.

14. The measuring method according to claim 13, wherein frequency-time partial test signals and frequency-time partial output signals associated in time and in the frequency domain are compared, wherein mutually associated frequency-time partial test signals and frequency-time partial output signals are determined on the basis of the synchronization.

15. The measuring method according to claim 14, wherein a frequency response and/or a noise level are determined from the comparison.

16. The measuring method according to claim 11, wherein frequency-time partial test signals suitable for a measurement are determined by comparison of their mean power with at least one upper and one lower threshold value.

17. The measuring method according to claim 12,
wherein frequency-time partial test signals suitable for a measurement are determined by comparison of their mean power with at least one upper and one lower threshold value.

18. The measuring method according to claim 13,
wherein frequency-time partial test signals suitable for a measurement are determined by comparison of their mean power with at least one upper and one lower threshold value.

19. The measuring method according to claim 14,
wherein frequency-time partial test signals suitable for a measurement are determined by comparison of their mean power with at least one upper and one lower threshold value.

20. The measuring method according to claim 15,
wherein frequency-time partial test signals suitable for a measurement are determined by comparison of their mean power with at least one upper and one lower threshold value.

* * * * *